(12) United States Patent
Ficke et al.

(10) Patent No.: US 8,751,982 B2
(45) Date of Patent: Jun. 10, 2014

(54) IMPLEMENTING DUAL SPEED LEVEL SHIFTER WITH AUTOMATIC MODE CONTROL

(75) Inventors: Joel T. Ficke, Bloomer, WI (US); David M. Friend, Rochester, MN (US); Grant P. Kesselring, Rochester, MN (US); James D. Strom, Rochester, MN (US); Jianguo Yao, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 13/602,164

(22) Filed: Sep. 2, 2012

(65) Prior Publication Data

US 2012/0331432 A1  Dec. 27, 2012

Related U.S. Application Data

(62) Division of application No. 13/030,516, filed on Feb. 18, 2011, now Pat. No. 8,324,933.

(51) Int. Cl.
*G06F 9/45* (2006.01)

(52) U.S. Cl.
USPC ............ 716/103; 326/68; 326/81; 327/333

(58) Field of Classification Search
USPC ................ 326/63, 68, 80–81; 327/333; 716/100–103
See application file for complete search history.

(56) References Cited

U.S. PATENT DOCUMENTS

| | | | |
|---|---|---|---|
| 5,424,657 A * | 6/1995 | Van Brunt et al. | 326/63 |
| 5,491,441 A | 2/1996 | Goetschel et al. | |
| 6,501,304 B1 | 12/2002 | Boerstler et al. | |
| 6,842,045 B2 * | 1/2005 | Shimazaki et al. | 326/95 |
| 2003/0173995 A1 * | 9/2003 | Cairns et al. | 326/81 |
| 2009/0015313 A1 * | 1/2009 | Matsushita | 327/333 |

* cited by examiner

*Primary Examiner* — Jason M Crawford
(74) *Attorney, Agent, or Firm* — Joan Pennington

(57) ABSTRACT

A method and circuit for implementing a dual speed level shifter with automatic mode control, and a design structure on which the subject circuit resides are provided. A low speed level shifter and a high speed level shifter are used to provide a wide frequency range of operation. The circuit operates in one of a low speed mode or a high speed mode. The appropriate mode is selected automatically by detecting the frequency of the signal to be level shifted. When the incoming signal is slower than a reference frequency, the low speed level shifter is selected, and when the incoming signal is faster than the reference frequency, the high speed level shifter is selected.

6 Claims, 4 Drawing Sheets

IMPLEMENTING DUAL SPEED LEVEL SHIFTER WITH AUTOMATIC MODE CONTROL

This application is a divisional application of Ser. No. 13/030,516 filed on Feb. 18, 2011.

FIELD OF THE INVENTION

The present invention relates generally to the data processing field, and more particularly, relates to a method and circuit for implementing a dual speed level shifter with automatic mode control, and a design structure on which the subject circuit resides.

DESCRIPTION OF THE RELATED ART

Level translator circuits are commonly used to pass signals across voltage domain boundaries. Many different level translators exist in the prior art, but most suffer from frequency range limitations.

U.S. Pat. No. 5,491,441 to Goetschel et al., issued Feb. 13, 1996 and assigned to the present assignee, discloses a method and apparatus for translating small voltage continuous signals into large full supply signals to generate a clock signal. At least one oscillator input signal is applied to a first amplifier stage for generating an amplified voltage output signal. A first inverter is connected to the first amplifier stage. A second inverter is connected to the first inverter. An AC capacitor applies the amplified voltage output signal to the first inverter input, and a feedback resistor is connected between the output and input of the first inverter. This is an example of a level shifter that works well at high frequencies, but exhibits problems at low frequencies.

Some topologies function well at frequencies below 500 MHz, but can not pass signals any higher. Other arrangements, such as U.S. Pat. No. 5,491,441 works well when tuned to run in the GHz range, but suffer from voltage overshoots and duty cycle issues at low frequencies.

It would be advantageous to have a level shifter circuit that would perform across a very wide frequency range. An example of a circuit that needs a level shifter that performs across a very wide frequency range is a phase locked loop (PLL) circuit. Typically, PLL circuits have one voltage domain for analog circuits, such as a phase frequency detector (PFD), charge pump (CP), voltage controlled oscillator (VCO) and another voltage domain for the digital circuits, such as dividers, control logic, and the like. As a result, a level translator must be used anywhere a signal passes from one voltage domain to the other voltage domain. The domain boundary at the output of the VCO must support a wide range of frequencies.

A need exists for a circuit having an efficient and effective mechanism for implementing a dual speed level shifter with automatic mode control.

SUMMARY OF THE INVENTION

Principal aspects of the present invention are to provide a method and circuit for implementing a dual speed level shifter with automatic mode control. Other important aspects of the present invention are to provide such method, circuit and design structure substantially without negative effects and that overcome many of the disadvantages of prior art arrangements.

In brief, a method and circuit for implementing a dual speed level shifter with automatic mode control, and a design structure on which the subject circuit resides are provided. A low speed level shifter and a high speed level shifter are used to provide a wide frequency range of operation. The circuit operates in one of a low speed mode or a high speed mode. The appropriate mode is selected automatically by detecting the frequency of the signal to be level shifted. When the incoming signal is slower than a reference frequency, the low speed level shifter is selected, and when the incoming signal is faster than the reference frequency, the high speed level shifter is selected.

In accordance with features of the invention, the automatic mode selection is fully digital, eliminating the requirement for analog circuit tuning. The circuit enables a hysteresis function to allow the low-to-high transition for a slow mode to occur at a different incoming signal frequency than the high-to-low transition. The amount of hysteresis is easily programmed, for example, depending on a particular circuit application.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing a dual speed level shifter with automatic mode control, and a design structure on which the subject circuit resides are provided.

Figure 1:
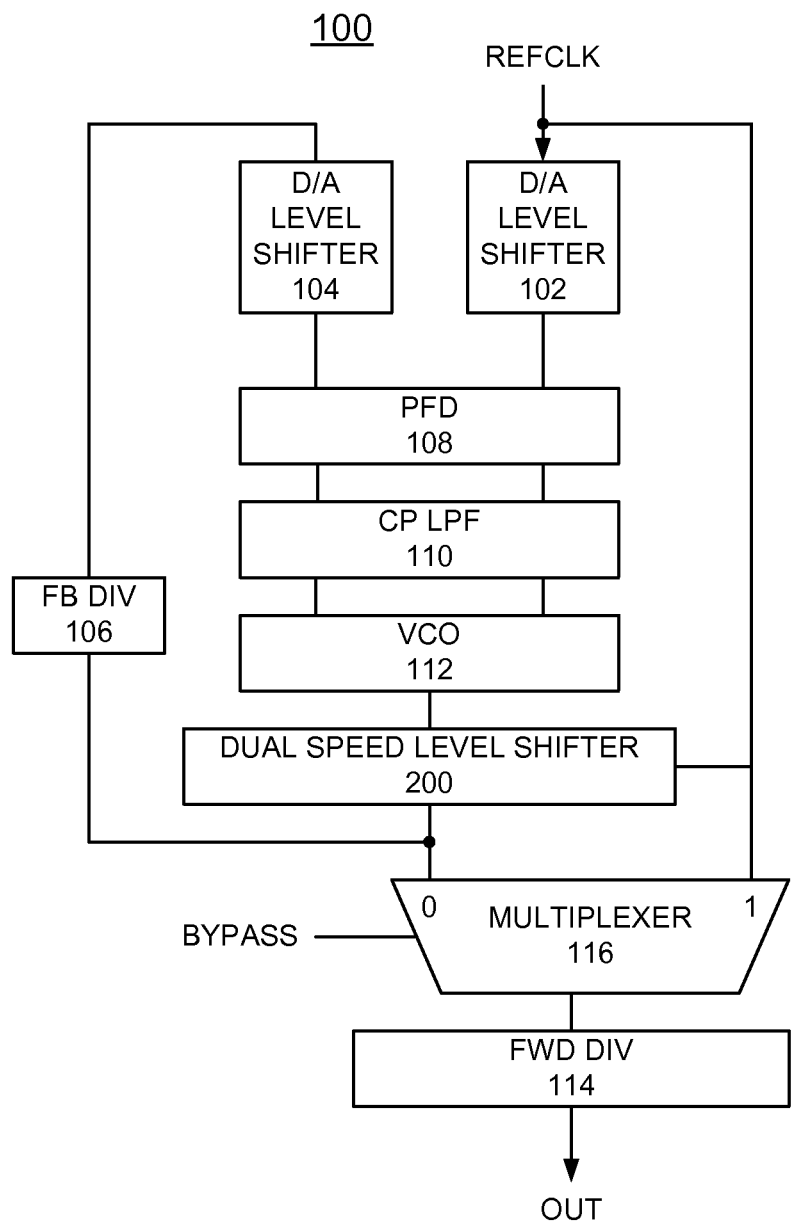
FIGS. 1 and 2 are respective schematic diagrams of a phase locked loop (PLL) circuit and an exemplary circuit for implementing a dual speed level shifter with automatic mode control included in the PLL circuit of FIG. 1 in accordance with the preferred embodiment.

Having reference now to the drawings, in FIG. 1, there is shown an example phase locked loop (PLL) circuit generally designated by the reference character 100 including an exemplary circuit 200 for implementing a dual speed level shifter with automatic mode control in accordance with the preferred embodiment.

PLL circuit 100 includes a first digital to analog (D/A) level shifter 102 receiving a reference clock input REFCLK and a second D/A level shifter 104 receiving a feedback signal output of a divider FB DIV 106. PLL circuit 100 includes a phase frequency detector 108 receiving the outputs of D/A level shifter 102 and D/A level shifter 104, and providing increment and decrement signals applied to a charge pump and loop filter CP LPF 110, which provides the differential loop filter signal voltage, applied to a voltage controlled oscillator (VCO) 112.

A dual speed level shifter circuit 200 with automatic mode control of the invention receives the output of the VCO 112 and the reference clock input REFCLK. The dual speed level shifter circuit 200 includes a low speed level shifter and a high speed level shifter that are used to provide a wide frequency range of operation. The dual speed level shifter circuit 200 operates in one of a low speed mode or a high speed mode. The appropriate mode is selected automatically by detecting the frequency of the received VCO clock frequency signal to be level shifted in the PLL circuit 100. When the incoming VCO clock frequency signal is slower than the reference clock input REFCLK, the low speed level shifter is selected, and when the incoming VCO clock frequency signal is faster than the reference clock input REFCLK, the high speed level shifter is selected.

The output of the dual speed level shifter circuit 200 is applied to the feedback divider FB DIV 106 and applied to a forward divider FWD DIV 114 via a two input multiplexer 116. The reference clock input REFCLK is applied to the other input of the two input multiplexer 116, which provides the PLL output.

Figure 2:
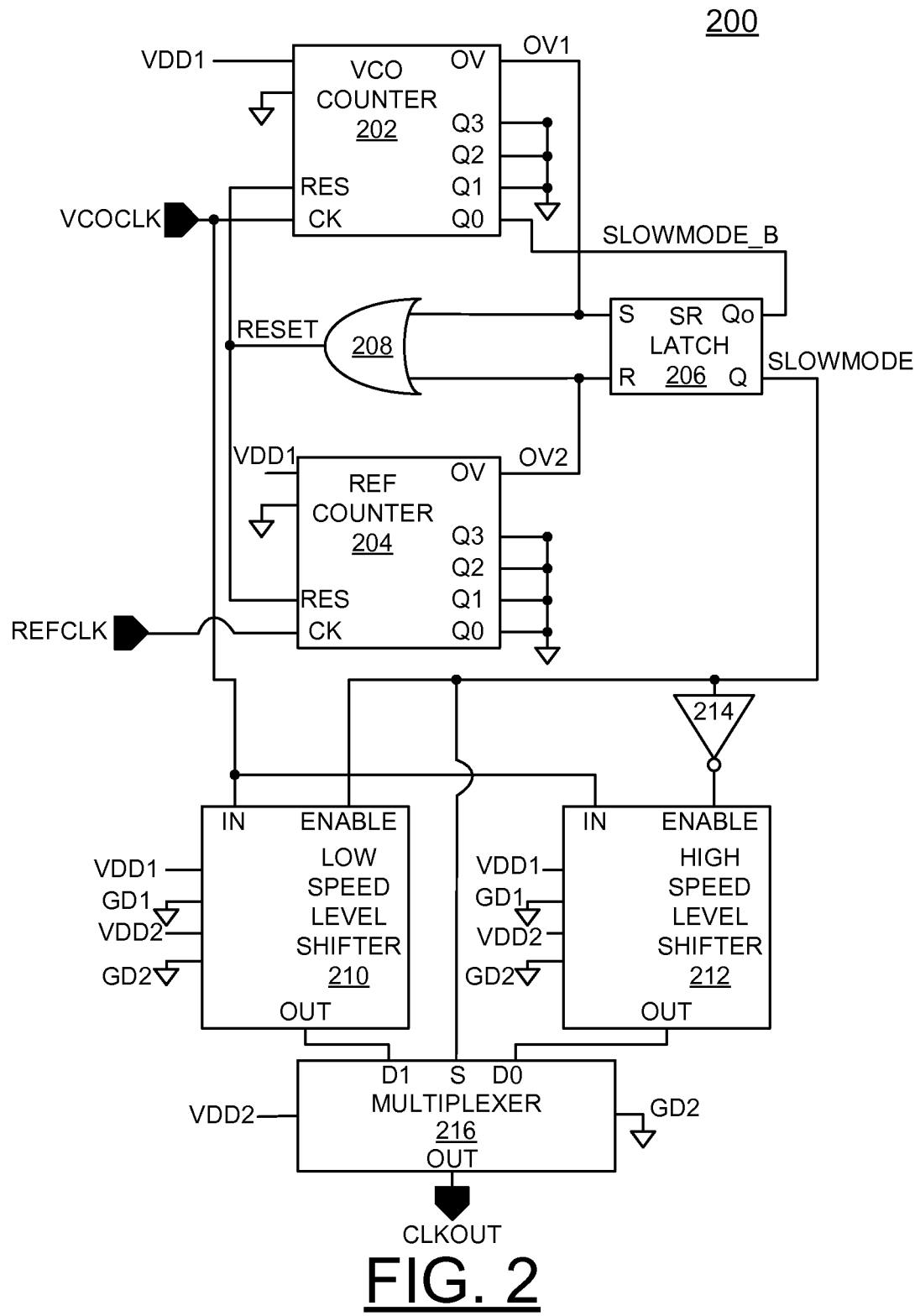

Referring now to FIG. 2, the dual speed level shifter circuit 200 includes a VCO counter 202 receiving a VCO frequency input and a REF counter 204 receiving the reference clock input REFCLK. The VCO counter 202 and the REF counter 204 are equal in size in the number of counter bits or register depth.

An overflow bit OV1 of the VCO counter 202 is applied to a set input S of an SR latch 206 and to a first input of an OR gate 208. An overflow bit OV2 of the REF counter 204 is applied to a reset input R of the SR latch 206 and to a second input of the OR gate 208. The output of the OR gate 208 provides a reset input RESET to the VCO counter 202 and the REF counter 204. The output Q of the SR latch 206 is a mode select signal SLOWMODE that enables either a low speed level shifter circuit 210 or a high speed level shifter circuit 212.

The appropriate low or high speed mode is selected automatically by detecting the frequency of the VCO frequency input signal to be level shifted. If the incoming VCO frequency input signal is slower than a reference frequency REFCLK, the low speed level shifter 210 is selected, and if the incoming VCO frequency input signal is faster than a reference frequency REFCLK, the high speed level shifter 212 is selected.

The mode select signal SLOWMODE is applied to an enable input of the low speed level shifter circuit 210, and is inverted by an inverter 214 and applied to an enable input of the high speed level shifter circuit 212. The VCO frequency input is applied to an input of the low speed level shifter circuit 210, and to an input of the high speed level shifter circuit 212.

A first input and a second input of a multiplexer 216 is connected to an output of the low speed level shifter circuit 210 and the high speed level shifter circuit 212, and provides an output CLKOUT from either the low speed level shifter circuit 210 or the high speed level shifter circuit 212 responsive to the mode select signal SLOWMODE.

The low speed level shifter circuit 210, and the high speed level shifter circuit 212 include a first voltage supply VDD1 and ground G1, and a second voltage supply VDD2 and ground G2. The VCO counter 202, the REF counter 204, the SR latch 206, the OR gate 208, and the inverter 214 include the first voltage supply VDD1 and ground G1. The multiplexer 216 include the second voltage supply VDD2 and ground G2.

Figure 3:
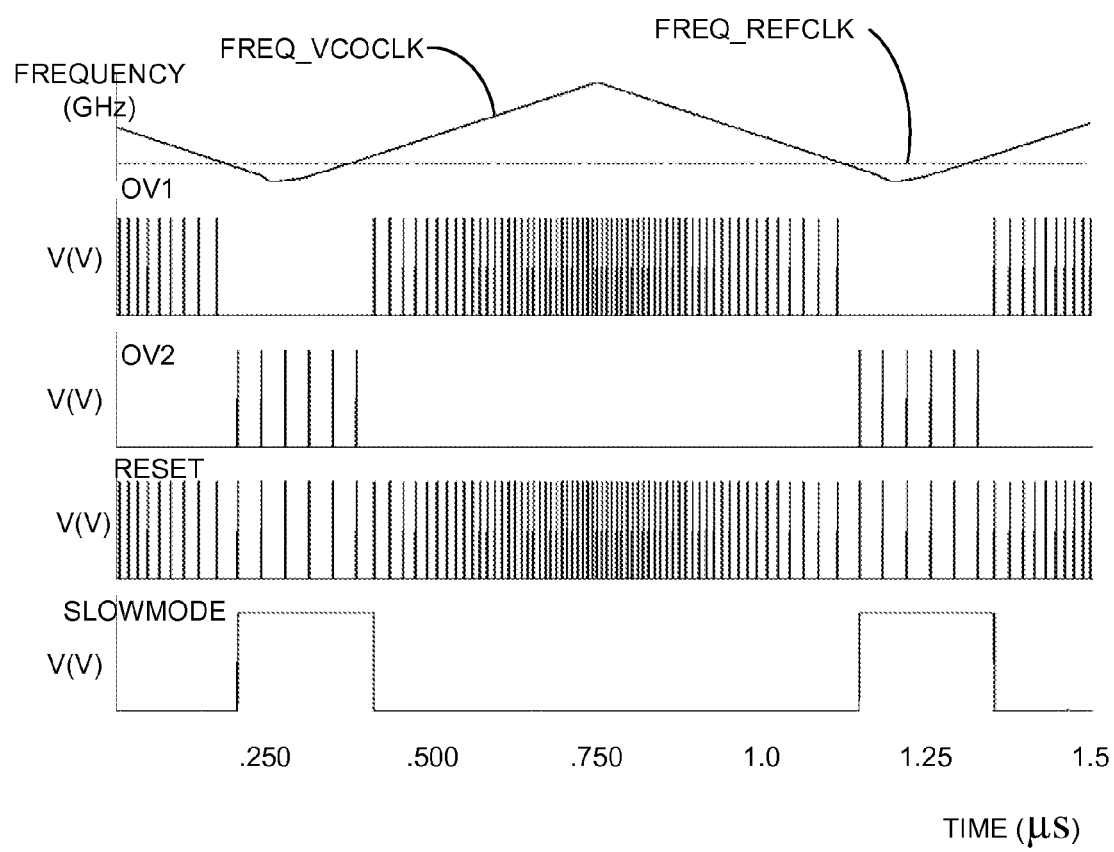
FIG. 3 are example waveforms illustrating example operation of the circuit of FIG. 2 for implementing a dual speed level shifter with automatic mode control in accordance with the preferred embodiment.

Referring also to FIG. 3, there are shown example waveforms illustrating example operation of the dual speed level shifter circuit 200 for implementing a dual speed level shifter with automatic mode control in accordance with the preferred embodiment.

When the VCOCLK frequency is greater than the REFCLK frequency, the VCO counter 202 overflows before the REF counter 204. The overflow signal OV1 of VCO counter 202 resets both counters 202, 204 via the OR gate 208 and sets the SR latch 206. This operation continues unless the VCOCLK frequency becomes less than the REFCLK frequency. In this case, the REF counter 204 overflows before the VCO counter 202 overflows. The overflow signal OV2 of REF counter 204 resets both counters 202, 204 via the OR gate 208 and resets the SR latch 206.

When the SR latch 206 is set the output signal SLOWMODE is low. When the SR latch 206 is reset the output signal SLOWMODE is high. The output signal SLOWMODE is applied to the enable of the low speed level shifter circuit 210 and the high speed level shifter circuit 212 via the inverter 214, and to the select line of the multiplexer 216 that selects the output of the low speed level shifter circuit 210 responsive to the output signal SLOWMODE being high, or the high speed level shifter circuit 212 responsive to the output signal SLOWMODE being low.

In accordance with features of the invention, the dual speed level shifter circuit 200 includes a hysteresis function to allow the low-to-high transition of slowmode to occur at a different VCOCLK frequency than the high-to-low transition. This hysteresis function prevents the SLOWMODE signal from chattering, when the VCOCLK frequency is near the REFCLK frequency.

An inverted output signal SLOWMODE_B of the SR latch 206 is applied to a least significant bit (LSB) of the VCO counter 202. Each time the counters 202, 204 are reset, the VCO counter 202 is initialized to Q[3:0]=0000 or Q[3:0]=0001 based on the level of SLOWMODE. In other words, when SLOWMODE is high, the counter sequence length is $2^N$, when SLOWMODE is low the counter sequence length is $2^N-1$, where N=number of bits of the VCO counter 202.

In general, the transition from slow to fast mode will happen when:

$$f_{vco} > f_{ref}$$

The transition from fast to slow will happen when:

$$f_{vco} < f_{ref} * ((2^N-1)/(2^N))$$

For example, suppose the REFCLK frequency is 250 MHz. When the VCO is ramping up, the SLOWMODE signal goes from high to low when $f_{vco}$ exceeds 250 MHz. Now, the SLOWMODE signal is low and the VCO counter 202 is initialized with a 1 each time it is reset. When the VCO ramps back down, the SLOWMODE signal goes from high to low at a VCOCLK frequency of 243 MHz instead of 250 MHz because:

$$f_{vco} < f_{ref} * ((2^N - 1)/(2^N)) < 250 \text{ MHz} * (15/16) < 243 \text{ MHz}$$

A larger degree of hysteresis can be programmed, for example, by using the SLOWMODE signal to initialize more bits of the VCO counter 202.

It should be understood that the dual speed level shifter circuit 200 can be used in multiple different circuits and various applications. It should be understood that the dual speed level shifter circuit 200 is not limited to use in the illustrated PLL circuit 100.

Figure 4:
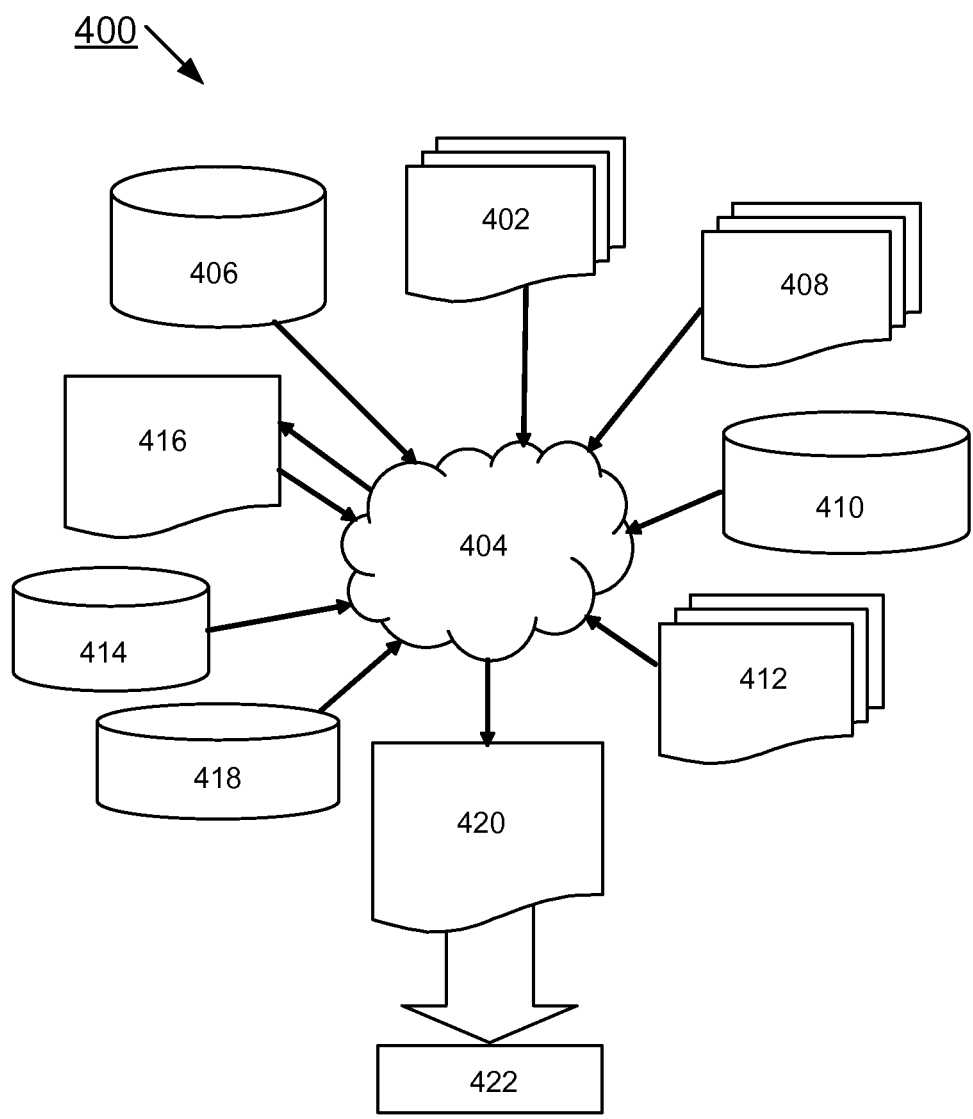
FIG. 4 is a flow diagram of a design process used in semiconductor design, manufacturing, and/or test.

FIG. 4 is a flow diagram of a design process used in semiconductor design, manufacturing, and/or test. FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuits 100, 200 in the form of schematics or HDL, a hardware-description language, for example, Verilog, VHDL, C, and the like. Design structure 402 may be contained on one or more machine readable medium. For example, design structure 402 may be a text file or a graphical representation of circuits 100, 200. Design process 404 preferably synthesizes, or translates, circuit 100 into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuit.

Design process 404 may include using a variety of inputs; for example, inputs from library elements 404 which may house a set of commonly used elements, circuits, and devices, including models, layouts, and symbolic representations, for a given manufacturing technology, such as different technology nodes, 42 nm, 45 nm, 90 nm, and the like, design specifications 410, characterization data 412, verification data 414, design rules 416, and test data files 418, which may include test patterns and other testing information. Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates embodiments of the invention as shown in FIGS. 1 and 2, along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1 and 2. Design structure 420 may then proceed to a stage 422 where, for example, design structure 420 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A design structure embodied in a non-transitory machine readable medium used in a design process, the design structure comprising:

a circuit tangibly embodied in the non-transitory machine readable medium used in the design process, said circuit for implementing a dual speed level shifter with automatic mode control, said circuit comprising:

a low speed level shifter and a high speed level shifter, each receiving an incoming signal to be level shifted and each having an enable input;

a first counter receiving the incoming signal to be level shifted;

a second counter receiving a reference signal; said first counter and said second counter having an equal size; each of said first counter and said second counter having a respective overflow output; and a set reset latch (SR) latch receiving a respective set input and reset input of said respective overflow outputs for automatically selecting a low speed mode enabling the low speed level shifter or a high speed mode enabling the high speed level shifter, the design structure, when read and used in the manufacture of a semiconductor chip produces a chip comprising said circuit.

2. The design structure of claim 1, wherein the design structure comprises a netlist, which describes said circuit.

3. The design structure of claim 1, wherein the design structure resides on storage medium as a data format used for the exchange of layout data of integrated circuits.

4. The design structure of claim 1, wherein the design structure includes at least one of test data files, characterization data, verification data, or design specifications.

5. The design structure of claim 1, includes a multiplexer coupled to an output of said low speed level shifter and said high speed level shifter, said mode select output signal applied to a select input of said multiplexer; said multiplexer providing an output from either said low speed level shifter circuit or said high speed level shifter circuit responsive to the mode select output signal.

6. The design structure of claim 1, includes an OR gate receiving said respective overflow outputs for generating a reset signal; and said reset signal being applied to a respective reset input of said first counter and said second counter.

* * * * *